United States Patent [19]

Nath et al.

[11] Patent Number: 5,092,939
[45] Date of Patent: Mar. 3, 1992

[54] PHOTOVOLTAIC ROOF AND METHOD OF MAKING SAME

[75] Inventors: Prem Nath, Rochester Hills; Timothy Laarman, Almont, both of Mich.

[73] Assignee: United Solar Systems Corporation, Troy, Mich.

[21] Appl. No.: 620,047

[22] Filed: Nov. 30, 1990

[51] Int. Cl.$^5$ ............... H01L 31/048; H01L 31/18; H01L 31/05

[52] U.S. Cl. ............... 136/251; 136/291; 52/173 R; 52/509; 437/2

[58] Field of Search ............... 136/244, 251, 291; 437/2-5, 205, 207, 209, 224; 52/509, 173 R

[56] References Cited

U.S. PATENT DOCUMENTS

| | | | |
|---|---|---|---|
| 4,189,881 | 2/1980 | Hawley | 52/220 |
| 4,217,374 | 8/1980 | Ovshinsky et al. | 427/39 |
| 4,226,898 | 10/1980 | Ovshinsky et al. | 427/39 |
| 4,336,413 | 6/1982 | Tourneux | 136/251 |
| 4,773,944 | 9/1988 | Nath et al. | 136/249 TJ |
| 4,860,509 | 8/1989 | Laaly et al. | 52/173 R |

Primary Examiner—Aaron Weisstuch
Attorney, Agent, or Firm—Krass & Young

[57] ABSTRACT

A roof structure 10 comprises panels 14 and 16 of desired length each having a galvanized steel supportive layer which has side supporting flanges 22 interconnected together to form the roof assembly 10. The mid portion 20 of each panel has a photovoltaic surface made from amorphous semiconductor material which is laminated onto the galvanized steel with a protective plastic transparent polymer coating laminated above the photovoltaic material. The laminated galvanized steel and the photovoltaic layers are rolled into a coil and transported on site where it is unrolled, cut to size having the flanges formed to construct the rigid panels and having the panels assembled together via clips 26 and weather-proof battens 32. The photovoltaic surfaces are connected together via electrical conduit 34 coupled through couplings 88 under the panels and between the frame members 30.

11 Claims, 3 Drawing Sheets

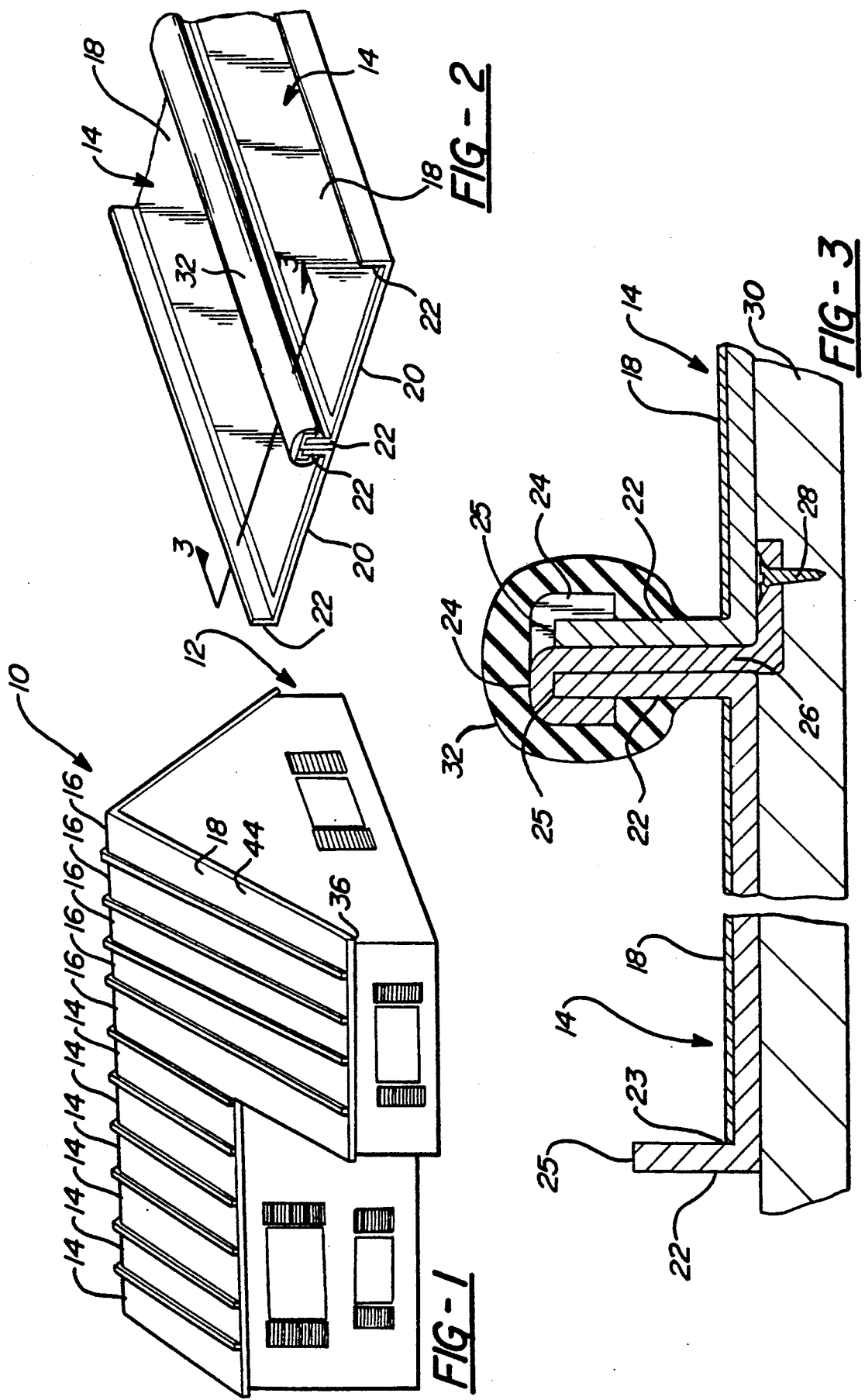

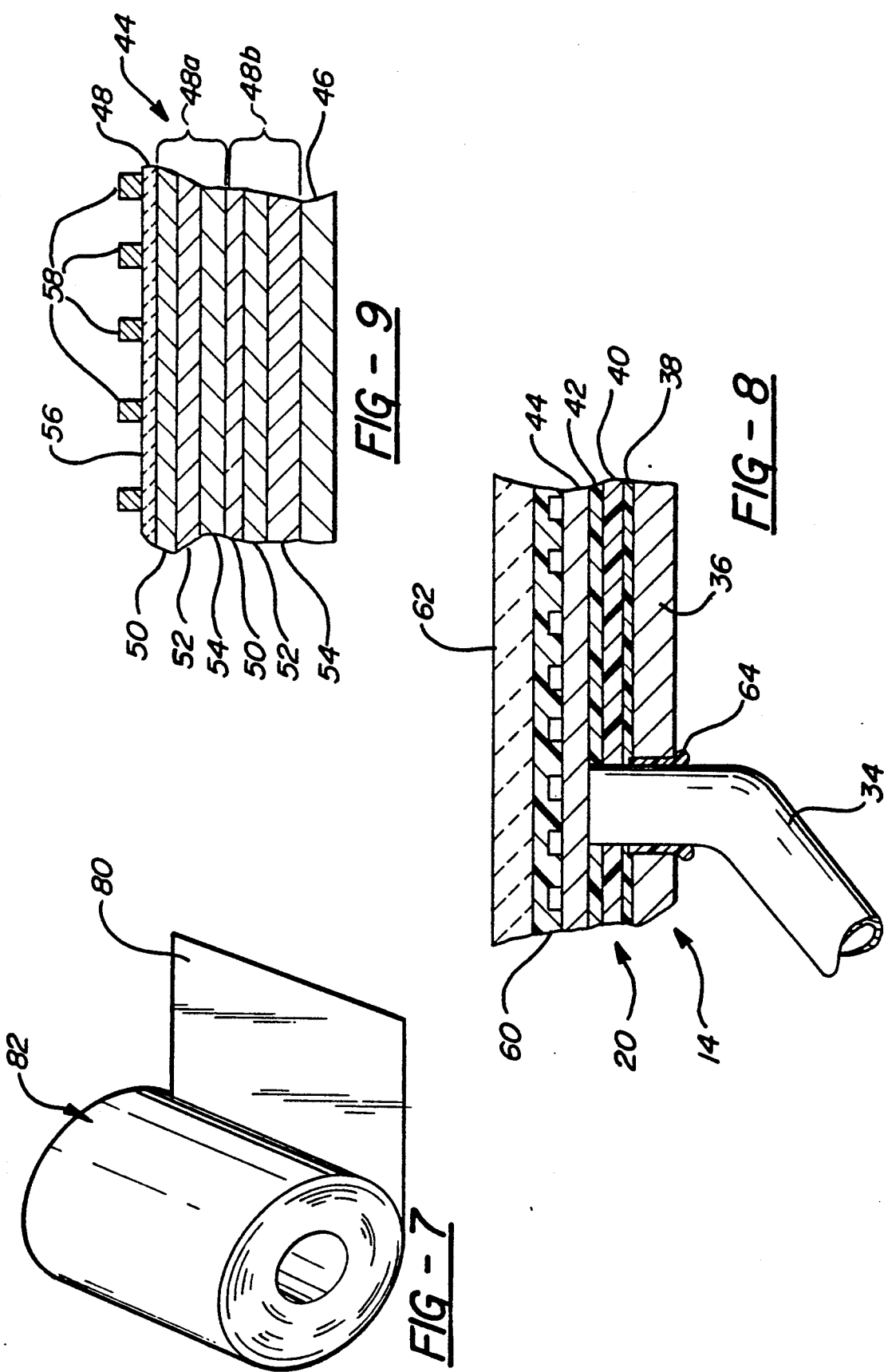

PHOTOVOLTAIC ROOF AND METHOD OF MAKING SAME

FIELD OF THE INVENTION

The present invention generally relates to photovoltaic devices and more specifically to a photovoltaic device that can be assembled into a rigid panel assembly or roof structure.

BACKGROUND OF THE INVENTION

Photovoltaic energy is becoming a very significant power source for several reasons. Fossil fuels are becoming scarcer, and hence more expensive, every day. Furthermore, the burning of fossil fuels releases pollutants, including greenhouse gases which contribute to problems of global warming. Also, recent events have raised questions as to the safety and cost-effectiveness of nuclear power. For these reasons, traditional energy sources have become far less attractive. Photovoltaic energy, on the other hand, is inherently non-polluting, safe and silent. In addition, recent advances in photovoltaic technology have significantly increased the efficiency and decreased the cost of such devices.

For example, it is now possible to manufacture large area silicon and/or germanium alloy materials which manifest electrical, optical, chemical, and physical properties equivalent, and in many instances superior to, their single crystalline counterparts. Layers of such alloys can be economically deposited at high speed over relatively large areas and in a variety of stacked configurations. Such alloys readily lend themselves to the manufacture of low cost photovoltaic devices. Examples of particular fluorinated semiconductor alloy materials having significant utility in fabrication of photovoltaic devices are described in U.S. Pat. No. 4,226,898 and U.S. Pat. No. 4,217,364, both invented by Ovshinsky et al, the disclosures of which are incorporated herein by reference.

Thin film silicon and/or germanium alloy materials have found many applications from incorporation in calculators to large area grids for providing power to either homes or neighborhoods or even whole communities.

Previous attempts at incorporating photovoltaic material as a roofing surface has involved prefabricated panels with single crystalline photovoltaic cells mounted on the panels. The panels are assembled together in a standard batten-seam roof construction. What is needed is an economical and cost-effective system for constructing a panel or roof structure on site combining the flexibility of thin film photovoltaic materials and the semi-flexibility of sheets of roofing construction material such as galvanized steel to form a coil of thin film photovoltaic material laminated onto a galvanized steel substrate. What is also needed is a laminate that can be formed into photovoltaic roofing panels on site or off site and installed and connected together to form a roof assembly.

SUMMARY OF THE INVENTION

In accordance with one aspect of the invention, a photovoltaic panel assembly includes a plurality of panels with each panel having a thin film photovoltaic layer laminated on a substrate material to form a laminate. The substrate material has sides extending widthwise beyond the laminated aligned photovoltaic material and each side edge of the substrate material is formed, preferably orthogonally, with respect to the plane of the photovoltaic material to form an reinforcing flange that gives longitudinal rigidity to the panel. In one embodiment the flanges are formed upwardly toward the photovoltaic laminated side of the panel.

Each panel is assembled and fastened to a substructure such as framing made from lumber. The panel is fastened by a retaining clip engagable to two adjacent upturned flanges of two adjacent panels. A fastener secures the clip to the frame. A batten is positioned onto the two upturned flanges of the panels and covers the clip and fastener.

The photovoltaic material provides an electric output and has an operable electrical connector. Each panel has an electrical connector extending through the substrate for operable connection to an adjacent panel. In one embodiment the electrical connector has a coupler at its distal end engagable to a coupler of an electrical connector of an adjacent panel.

Preferably, the laminate has transversely extending and intervally spaced cutting areas between photovoltaic areas such that the laminate can be cut to length at one of the cutting areas. These lengths can be predetermined and customized. It is foreseen that the cutting areas can be commonly spaced apart at 2, 4 or 8 feet spaced apart.

A method for installing the above-identified panel structure includes manufacturing laminated photovoltaic panels from a continuous length of structural substrate material and a flexible photovoltaic material laminated thereon to form a laminate. The laminate is then coiled into a roll. The laminate material is then transported to a building site and strips of desired length are unrolled and cut from the roll at the cutting area. The panels are reinforced preferably by having the side edges of the substrate material formed perpendicular to the photovoltaic material to form the reinforcing flanges. The panels are then fastened onto a support substructure in parallel fashion.

The photovoltaic material on the parallel panels are electrically interconnected. In one embodiment a mounting cover between adjacent panels then extends over two adjacent flanges of adjacent panels. Preferably the electrically interconnecting step includes engagable electrical connector located under the panels and extending to connect to a like connector of an adjacent panel or an adjacent section of photovoltaic material.

BRIEF DESCRIPTION OF THE DRAWINGS

Reference now is made to the accompanying drawings in which:

FIG. 1 is a perspective view of a roofing structure in accordance with one embodiment of the invention on a building;

FIG. 2 is an enlarged fragmentary view of two interconnected panels of the roofing structure shown in FIG. 1;

FIG. 3 is a fragmentary cross-sectional view taken along the lines 3—3 shown in FIG. 2;

FIG. 7 is a perspective view of the laminate coiled into a roll;

FIG. 8 is a cross-sectional schematic view of the panel taken along the lines 8—8 in FIG. 6; and FIG. 9 is an enlarged schematic cross-sectional view of the photovoltaic layer of material.

DETAILED DESCRIPTION OF THE PREFERRED EMBODIMENT

Figure 4:
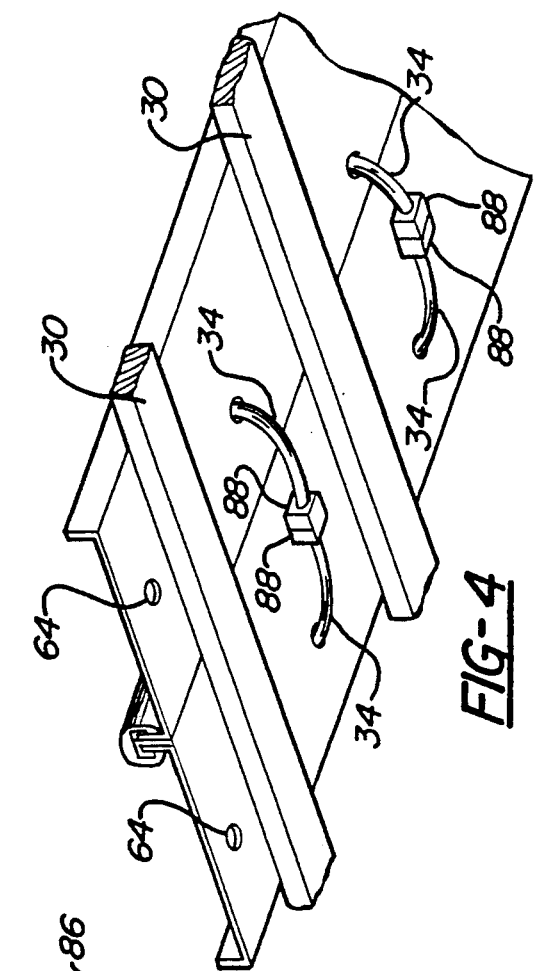
FIG. 4 is a bottom perspective view of the roofing structure shown in FIG. 2.

Referring particularly to FIG. 1, a roof structure 10 is mounted on a housing structure 12. The roof structure 10 includes a plurality of panels 14 of one length and panels 16 of a longer length. Panels 14 and 16 each have a photovoltaic material 44 laminated on a structural substrate 36 and which is visible to the ambient exterior through a transparent protective coating 62 shown in FIG. 8. For future reference, each panel 14 and 16 is identical except for its length and a future reference is only made to panel 14 unless specified otherwise. As shown in FIG. 2, the material 44 forms a photovoltaic electric generating area 18 positioned at a midsection 20 of each panel 14. Each panel 14 also has two side flanges 22 which are bent perpendicularly upward along the length of the panel 14. The flanges 22 provide reinforcement or rigidity along the length of the panel. The bottom of the flange 22 is adjacent the photovoltaic area 18.

The assembly of the panels 14 is shown in detail in FIG. 3. Two flanges 22 of each of adjacent parallel panels 14 are closely spaced together. A clip 26 is interposed between the flanges 22 and has two overlying ends 24 engaging the upper ends 25 of flanges 22. The clip 26 has a bottom section 28 which is secured to an underlying frame member 30 such as a truss member or furring strip. A batten 32 overlies the adjacent flanges 22 to provide for a weather-proof seal. The batten 32 can be snap-fitted onto the ends 24 of clip 26.

As shown in FIG. 4, the photovoltaic material 44 of one panel is connected to the photovoltaic material 44 of an adjacent panel via electrical conduit 34 which is fitted between the frame members 30 and electrically connects the photovoltaic material 44 together. Further detail of this electrical connection will be explained after the detailed explanation of the internal structure of the panels 14 as follows.

Each midsection 20 of the panel 14 is a multiple laminated material. As shown in FIG. 8, the bottom structural substrate 36 is galvanized steel. An ethylene vinyl acetate (EVA) layer 38 is laid upon the galvanized steel 36 and acts as a bonding agent between the galvanized steel 36 and an insulating layer 40 which can be Darkek nylon. Another EVA layer 42 is placed upon the insulating layer 40. The photovoltaic material 4 is adhered to the top of the EVA layer 42.

The photovoltaic layer 44 is shown in more detail in FIG. 9. The photovoltaic layer 44 includes a bottom electrode 46 of stainless steel. Metalized plastic can substitute for the stainless steel. On top of the electrode layer steel 46, a plurality of thin film p-i-n cells 48 can be laid side by side to form an array of cells. Each cell 48 can be made from a plurality of p-i-n subcells 48a and 48b stacked upon each other. Each of the subcells 48a and 48b in this embodiment is fabricated with amorphous semiconductor materials containing at least one layer of a silicon or germanium alloy material. Each of the semiconductor material subcells 48a and 48b include an n-type conductivity layer 50, an intrinsic layer 52 and a p-type conductivity layer 54. As illustrated there are two p-i-n cells 48 stacked on top of each other. However, different numbers of cells ma be stacked and n-i-p cells as well as cells of other thin film configurations may be used. The FIGS. 8 and 9 are not drawn to scale. In normal construction application the galvanized steel layer 36 can be 0.015 inch thick. The stainless steel layer 46 is typically 0.005 inch thick. The semiconductor cell layers 50, 52 and 54 are microns in thickness and can only be illustrated out of scale.

Disposed atop the semiconductor layers 50, 52 and 54 is a body of transparent conductive oxide (TCO) 56. The layer 56 functions as the upper electrode of the device and cooperates with the bottom stainless steel layer 46 to establish a current path through the photovoltaic layer 44. An electrode grid 58 may be added to the device where the cell is of a sufficiently large area or if the conductivity of the TCO layer 56 is insufficient. The grid 58 shortens the carrier path through the TCO and thus increases the collection efficiency of the photovoltaic layer 44. The thin film photovoltaic layer 44 can be manufactured over a large area in a roll-to-roll process so as to enable fabrication of the large area needed for creating the panels 14 and 16. Such techniques are disclosed in U.S. Pat. Nos. 4,410,558 and 4,485,125. These patents are incorporated herein by reference.

On top of the photovoltaic layer 44 is an EVA layer 60 topped with a clear plastic polymer 62. EVA layer 60 and the clear plastic polymer 62 are transparent to let light reach the photovoltaic layer 44.

The electrical conduit 34 passes through an aperture 64 through the galvanized steel 36, EVA layer 38, and insulator 44 to be in electrical contact with electrode layer 46. A similar complementary conduit can be in contact with a bus bar (not shown) in contact with grid 58 through another aperture 64 (not shown). Alternatively, the conduit 34 can be coaxial such that one electrical line can be in contact with grid 58 via a bus bar and the other electrical line can be in contact with the stainless steel electrode 46. Alternately, positive and negative connection terminals can be formed within apertures 64 for easy connection to conduit 34.

Figure 6:
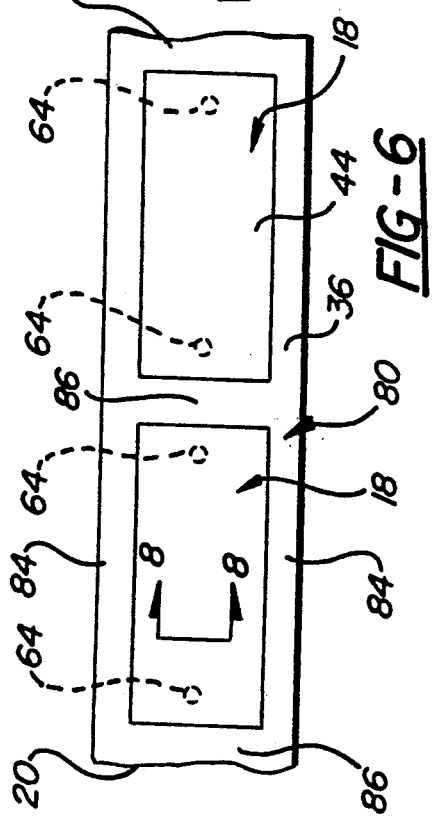
FIG. 6 is a top plan view of a fragmentary section of the laminate shown in FIG. 5.
Figure 5:
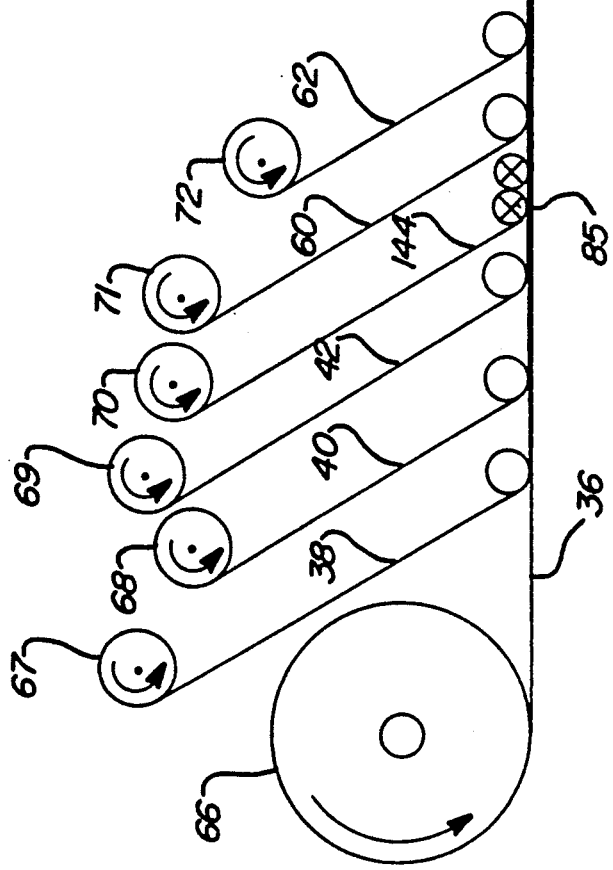
FIG. 5 is a schematic view of the method of manufacturing the laminate that forms the panels shown in FIG. 2.

Referring now to FIG. 5, the layers shown in FIG. 9 from are on various rolls 66, 67, 68, 69, 70, 71 and 72 and are laminated together via pressure exerted by rolls 74 and by heat supplied by temperature chamber 76. The formed laminate 80 is then rolled back into a coil 82 as shown in FIG. 7. As shown in FIG. 6, the laminate 80 has a specified width and a length substantially greater than its width. Rolls exceeding 1,000 feet long can be made via the described roll-to-roll method. The galvanized steel 36 has a width greater than the photovoltaic layer 44 such that side edges 84 are formed. Furthermore, the photovoltaic material 44 is cut and spaced apart into areas 18 by a cutter and roller mechanism 85 such that electrically insulated cutting areas 86 are regularly spaced between adjacent photovoltaic areas 18 on substrate 36. The cutting areas 86 may be in the nature of $\frac{1}{4}$ to $\frac{1}{2}$ inch wide.

Preferably, the EVA layer 60 and clear plastic polymer layer 62 are also wider than the photovoltaic layer 44 that when the flanges 22 are formed and the batten 32 is placed on the flanges 22, the clear polymer layer 62 passes under the batten so that the exterior portion of the roof panel is provided with a continuous polymer protective layer atop of the photovoltaic area 18.

The coil 82 of laminate 80 if desired can be transported to the construction site where the housing assembly 12 is located. For smaller jobs, the coil 82 can be transported to an assembly off site. The laminate is unrolled from coil 82 and is cut along the cutting areas 86 transverse to the length of the laminate 80 to form strips of desired length. The side edges 84 of the strips are then formed upwardly transverse to the midsection 20 of the laminate to form the side flanges 22 which function as a reinforcement for the formed substantially rigid roofing panel 14. The cut panels 14 with their flanges 22 are then assembled in place as illustrated in FIG. 1 through FIG. 4. The laminate 80 can be cut to the desired length such that when a longer panel 16 is desired, additional photovoltaic areas 18 can be incorporated in the length of the panel 16 by merely cutting it along another cutting area 86. Each photovoltaic area 18 can be 2 feet, 4 feet, or other common building unit in length.

The apertures 64 for the electrical conduits 34 are preferably adjacent the cutting area 86. The conduit 34 can end in a coupler 88 which is engagable to complementary coupler 88 of an electrical conduit 34 of the adjacent panel 14. The electrical conduits 34 can also connect the adjacent photovoltaic areas 18 of the same panel. The conduits merely have to pass under the frame member 30 after the panels are assembled thereon. The connection can be disposed to create either series or parallel connections to increase either amperage or voltage.

The illustrated roof assembly 10 discloses upwardly extending flanges 22. However, alternate constructions are possible where the flanges can be formed downwardly and in complex different directions of folds to form an interconnecting seamless roof with the photovoltaic area 18 still being exposed upwardly. If channels are desired between the panels 14, the panels can be spaced apart to form gaps or channels between the flanges 22. The apertures 64 can be substituted with bus bars extending to the side edges 84 and the electrical conduit 34 can extend downward from the bus bars between flanges 22.

In this fashion, an electrical roof or other panel structure assembly can be easily assembled. Thin film photovoltaic material can be laminated together and both the resulting laminate be coiled and transported to form strips of desired lengths. Long coils of laminate of having a thin film photovoltaic area laminated on one side can be uncoiled and cut to desired panel lengths on site, formed into rigid panels 14,16 and subsequently assembled to form the weatherproof and sealed roof assembly 10.

Variations of the present invention are possible without departing from its scope and spirit as defined by the appended claims.

We claim:

1. A method of installing a photovoltaic panel structure, said method characterized by the steps of:
providing a laminate including a photovoltaic device disposed on a front surface of a structural substrate material, said substrate material and photovoltaic device each having a preselected length and width such that the width of the device is less than the width of the substrate material, said device disposed on said substrate so as to define side edges of said substrate which are free of said device, said laminate further including a transparent polymeric layer disposed upon the front surface of said substrate so as to cover said photovoltaic device and at least a portion of said side edges, said laminate being semi-flexible and rolled up into a coil;
cutting strips of laminate off said coil;
reinforcing said strips by bending the side edges thereof to form flanges disposed at an angle to said front surface so as to form a plurality of substantially rigid photovoltaic panels, each panel including a photovoltaic device for providing electrical output in response to incident radiation;
electrically interconnecting said photovoltaic devices on said plurality of panels proximate the rear surface of the substrate material of said panels; and
fastening said panels onto a support substructure such that a sealed panel structure is formed on said support substructure.

2. A method as defined in claim 1 wherein said interconnecting step includes providing an electrical connector in electrical connection with said photovoltaic material of a first panel and passing through an aperture in said substrate material of said panel and disposed on a side of said substrate opposite of said photovoltaic material and in electrical connection to said photovoltaic material of a second panel through an aperture in the substrate of said second panel.

3. A method as defined in claim 2 wherein said electrical connector includes:
a first electrical conduit connected to said first panel and having a coupler at its distal end;
a second electrical conduit connected to said second panel and having a second coupler at its respective distal end; and
said first and second coupler being complementary and engagable to each other for an electrical connection between said first and second panel.

4. A method as defined in claim 3 wherein said electrical couplers are connected together to form series connections between the panels.

5. A method as defined in claim 3 wherein said electrical couplers are connected together to form parallel connections between the panels.

6. A method as defined in claim 1 wherein said substrate has transversely extending cutting areas regularly spaced along the length of the substrate; and
said cutting step includes cutting said strip at one of said intervally spaced cutting areas transversely to the length of said strip.

7. A photovoltaic panel assembly characterized by:
a plurality of panels, each panel having a thin film photovoltaic material laminated on a front surface of a planar, semi-flexible substrate material that has side edges extending widthwise beyond said photovoltaic material, said photovoltaic material including an electrically conductive lead in electrical communication therewith, said lead passing through an aperture in said substrate and terminating with a connector proximate a rear surface thereof; and
each side edge of substrate material being bent to form reinforcing flanges extending substantially perpendicular with respect to said photovoltaic material.

8. A photovoltaic panel assembly as defined in claim 7 further characterized by:
a fastening means for fastening said panels to a support substructure.

9. A photovoltaic panel assembly as defined in claim 8 wherein:

said flanges are turned upwardly toward a side of the panel that has the photovoltaic material laminated thereon;

said fastening means includes a clip engagable to two adjacent upturned flanges of two adjacent panels and a fastener securing said clip to said support substructure; and a batten being placed over said two upturned flanges of said adjacent panels and covering said clip and fastener.

10. A photovoltaic panel assembly as defined in claim 9 wherein said thin film photovoltaic material is sectioned into areas with said areas spaced apart on said substrate to form transversely extending cutting areas intervally spaced along the length of said laminate; each panel being cut to length at one of said cutting areas transversely through said substrate to the length of said substrate.

11. A photovoltaic panel assembly as defined in claim 7 wherein said thin film photovoltaic material is laminated on said substrate in sections of a repetitive predetermined length forming spaced apart cutting areas, each panel being cut to length at one of said cutting areas transversely through said substrate to the length of said substrate.

* * * * *